United States Patent
Muralimanohar et al.

(10) Patent No.: US 10,318,420 B2
(45) Date of Patent: Jun. 11, 2019

(54) DRAINING A WRITE QUEUE BASED ON INFORMATION FROM A READ QUEUE

(71) Applicant: Hewlett Packard Enterprise Development LP, Houston, TX (US)

(72) Inventors: Naveen Muralimanohar, Santa Clara, CA (US); Rajeev Balasubramonian, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/522,372

(22) PCT Filed: Oct. 31, 2014

(86) PCT No.: PCT/US2014/063357
§ 371 (c)(1),
(2) Date: Apr. 27, 2017

(87) PCT Pub. No.: WO2016/068986
PCT Pub. Date: May 6, 2016

(65) Prior Publication Data
US 2017/0315914 A1   Nov. 2, 2017

(51) Int. Cl.
*G11C 7/00* (2006.01)
*G06F 13/16* (2006.01)
(Continued)

(52) U.S. Cl.
CPC ...... *G06F 12/0806* (2013.01); *G06F 12/0804* (2013.01); *G06F 12/0811* (2013.01);
(Continued)

(58) Field of Classification Search
CPC ............. G06F 12/0806; G06F 12/0811; G06F 13/161; G06F 2212/283; G06F 2212/621
See application file for complete search history.

(56) References Cited

U.S. PATENT DOCUMENTS 5,717,948 A * 2/1998 Michalina ........... G06F 13/4036
710/1
6,111,807 A * 8/2000 Ooishi .................... G11C 7/22
365/189.05

(Continued)

FOREIGN PATENT DOCUMENTS

EP      1693760 A1    8/2006
WO   WO-2012109677 A2   8/2012

OTHER PUBLICATIONS

Chou, J. et al., Exploiting Replication for Energy-aware Scheduling in Disk Storage Systems, Sep. 18, 2014, IEEE Transactions on Parallel and Distributed Systems, No. 99, 15 pages.

(Continued)

*Primary Examiner* — Mano Padmanabhan
*Assistant Examiner* — William E. Baughman
(74) *Attorney, Agent, or Firm* — Hewlett Packard Enterprise Patent Department

(57) ABSTRACT

A method to access a memory chip having memory banks includes processing read requests in a read queue, and when a write queue is filled beyond a high watermark, stopping the processing of the read requests in the read queue and draining the write queue until the write queue is under a low watermark. Draining the write queue include issuing write requests in an order based on information in the read queue. When the write queue is under the low watermark, the method includes stopping the draining of the write queue and again processing the read requests in the read queue.

10 Claims, 7 Drawing Sheets

```
900 ─► Algorithm 1: Write latency aware memory scheduling
1    if number of writes in WQ > WQHT then
2        //start WQ drain
3        nW = 0;
4        maxWi = M for all banks;
5        while number of writes in WQ > WQLT do
6            maxWi = maxWi − num of read requests in bank i;
7            if maxWi ≤ 0 then
8                continue; //stop issuing write to bank i
9            else
10               issue one write ReqW to bank i;
11               nW = nW + 1;
12               if ReqW is fast write then
13                   maxWi = maxWi − 1;
14               else
15                   //a slow write takes more than 1 slot
16                   maxWi = maxWi − W;
17               end
18           end
19       end
20   else
21       issue reads from RQ;
22   end
```

(51) Int. Cl.
*G06F 12/084* (2016.01)
*G06F 12/0804* (2016.01)
*G06F 12/0806* (2016.01)
*G06F 12/0811* (2016.01)

(52) U.S. Cl.
CPC ........ *G06F 13/161* (2013.01); *G06F 13/1642* (2013.01); *G11C 7/00* (2013.01); *G06F 12/084* (2013.01); *G06F 2212/1024* (2013.01); *G06F 2212/283* (2013.01); *G06F 2212/502* (2013.01); *G06F 2212/621* (2013.01)

(56) References Cited

U.S. PATENT DOCUMENTS

| | | | | |
|---|---|---|---|---|
| 6,704,817 | B1* | 3/2004 | Steinman | G06F 13/4059 710/100 |
| 7,573,775 | B2 | 8/2009 | Fallah et al. | |
| 8,589,655 | B2 | 11/2013 | Colgrove et al. | |
| 2006/0123169 | A1* | 6/2006 | Chai | G06F 13/161 710/116 |
| 2006/0181953 | A1 | 8/2006 | Rotenberg et al. | |
| 2009/0019239 | A1 | 1/2009 | Allison et al. | |
| 2010/0312970 | A1 | 12/2010 | Bell et al. | |
| 2013/0166874 | A1* | 6/2013 | Auernhammer | G06F 12/1027 711/204 |
| 2014/0112055 | A1 | 4/2014 | Kawahara et al. | |
| 2015/0089121 | A1* | 3/2015 | Coudhury | G06F 12/0246 711/103 |
| 2015/0095605 | A1* | 4/2015 | Roberts | G06F 3/0659 711/167 |
| 2015/0293785 | A1* | 10/2015 | Murphy | G06F 9/5027 718/102 |

OTHER PUBLICATIONS

International Searching Authority, The International Search Report and the Written Opinion, PCT/US2014/063357, dated Jul. 13, 2015, 13 Pages.

Niladrish Chatterjee et al, Staged Reads: Mitigating The Impact of DRAM Writes on DRAM Reads, High Performance Computer Architecture (HPCA), 2012 IEEE 18th International Symposium on, IEEE, 2012, pp. 1-12, See p. 1, right column, lines 15-30; , p. 4, right column, line 22; p. 5, left coiumn, line 39: p. 6, left column, lines 37-38; p. 8, right column, lines 13-14; p. 9, left column, lines 2-4; p. 9, right coiumn, line 11; table 1; and figure 3.

Park, S. et al., FIOS: A Fair, Efficient Flash I/O Scheduler [online], Retrieved from the Internet < https://www.cs.rochester.edu/~kshen/papers/fast2012.pdf > [retrieved on Sep. 25, 2014, 15 pages.

Qureshi, M.K. et al., Improving Read Performance of Phase Change Memories via Write Cancellation and Write Pausing, Jan. 9-14, 2010, IEEE—HPCA, 11 pages.

Xu et al., "Overcoming the challenges of crossbar resistive memory architectures", IEEE 21st International Symposium on High Performance Computer Architecture (HPCA), 2015, pp. 476-488.

International Preliminary Report on Patentability received for PCT Patent Application No. PCT/US2014/063357, dated May 11, 2017, 9 pages.

* cited by examiner

```
900
    Algorithm 1: Write latency aware memory scheduling
1   if number of writes in WQ > WQHT then
2       //start WQ drain
3       nW = 0;
4       maxWi = M for all banks;
5       while number of writes in WQ > WQLT do
6           maxWi = maxWi − num of read requests in bank i;
7           if maxWi ≤ 0 then
8               continue; //stop issuing write to bank i
9           else
10              issue one write ReqW to bank i;
11              nW = nW + 1;
12              if ReqW is fast write then
13                  maxWi = maxWi − 1;
14              else
15                  //a slow write takes more than 1 slot
16                  maxWi = maxWi − W;
17              end
18          end
19      end
20  else
21      issue reads from RQ;
22  end
```

FIG. 9

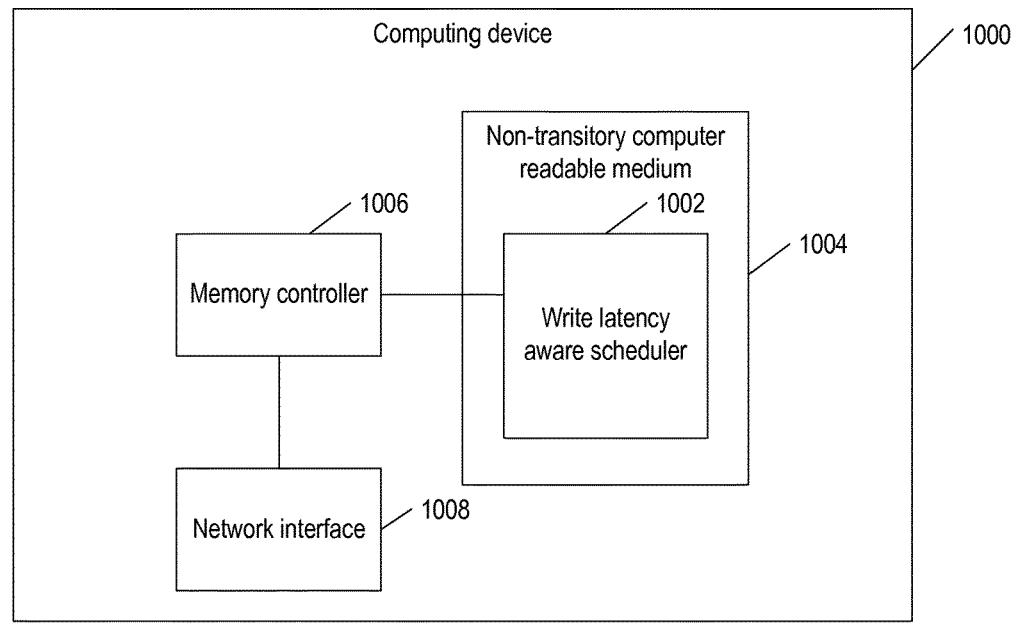

FIG. 10

DRAINING A WRITE QUEUE BASED ON INFORMATION FROM A READ QUEUE

BACKGROUND

Most modern processors employ a write-back policy in their last level caches (LLCs). Consequently, writes to the dynamic random access memory (DRAM) main memory are the result of the eviction of dirty cache-lines from the LLC so they are not on the critical path for program execution. The writes are typically buffered in a write queue and are serviced when there are no reads to service or when the write queue is nearly full.

Resistive memory is one of the emerging memory technologies that may replace DRAM as the main memory in computers. Resistive memory in general refers to any technology that uses varying cell resistance to store information. One type of resistive memory is metal-oxide resistive random access memory (ReRAM).

A ReRAM cell has a metal-oxide layer sandwiched between two metal electrodes. A low resistance state (LRS or ON-state) and a high resistance state (HRS or OFF-state) are used to represent the logical "1" and "0" respectively or vice versa. In order to switch a ReRAM cell, an external voltage with certain polarity, magnitude, and duration is applied to the metal oxide.

BRIEF DESCRIPTION OF THE DRAWINGS

In the drawings:

FIG. 9 is a pseudo code to implement a block in the method of FIG. 4 in examples of the present disclosure; and FIG. 10 is a block diagram of a computing device for implementing the transaction scheduler of FIG. 3 in examples of the present disclosure.

Use of the same reference numbers in different figures indicates similar or identical elements.

DETAILED DESCRIPTION

In many resistive memory technologies, such as memristor memories, the time to switch a cell from logical "1" to "0" or "0" to "1" is a function of voltage applied across a memory cell. In a crossbar array, currents flow through half-selected cells in the same wordline and bitline as a fully selected cell in addition a current flowing through the fully selected cell. These "sneak" currents contribute to voltage loss across the selected wordline. The "IR" drop of a cell along the wordline is a function of the distance between the cell and the voltage source. Hence, cells that are closer to a driver will have more voltage across them when compared to cells that are farther away. The variation in the voltages across the cells results in different cells having different write latencies based on their locations in the crossbar array.

In a typical memory, write latency is defined by a single value based on the worst case latency of the least favorably located cell in all the arrays. This pessimistic design can significantly impact performance.

There may be two reasons for different writes having different latencies. First, the location of a bit being written in a crossbar array determines its worst case write latency. Second, when writing multiple bits to a crossbar array, the latency depends on how many 0's and 1's are in a word and the order in which the 0's and 1's occur.

In examples of the present disclosure, instead of having one write latency for all memory cells in a crossbar array, the memory cells are grouped by regions based on their write latencies. The different write latencies of the regions are provided to a memory controller so the memory controller may efficiently schedule write requests to those regions.

In a typical memory system employing a bidirectional data bus, writes are held in a write queue in a memory controller. Once the write queue is filled beyond a high watermark, the memory controller turns around the data bus and flushes the writes until the write queue is under a low watermark. As writes are often on the non-critical path for program execution, delaying the writes may have no negative impact on performance. Nonetheless subsequent reads have to wait during the write flush, which may negatively impact performance.

In some examples of the present disclosure, to reduce the negative impact of reads waiting for writes to finish flushing, a memory controller considers a write's latency and the number of outstanding reads to a memory bank to receive the write when deciding whether or not to issue the write. The memory controller may schedule writes such that slow writes are written to memory banks with lowest number of outstanding reads.

Figure 1:
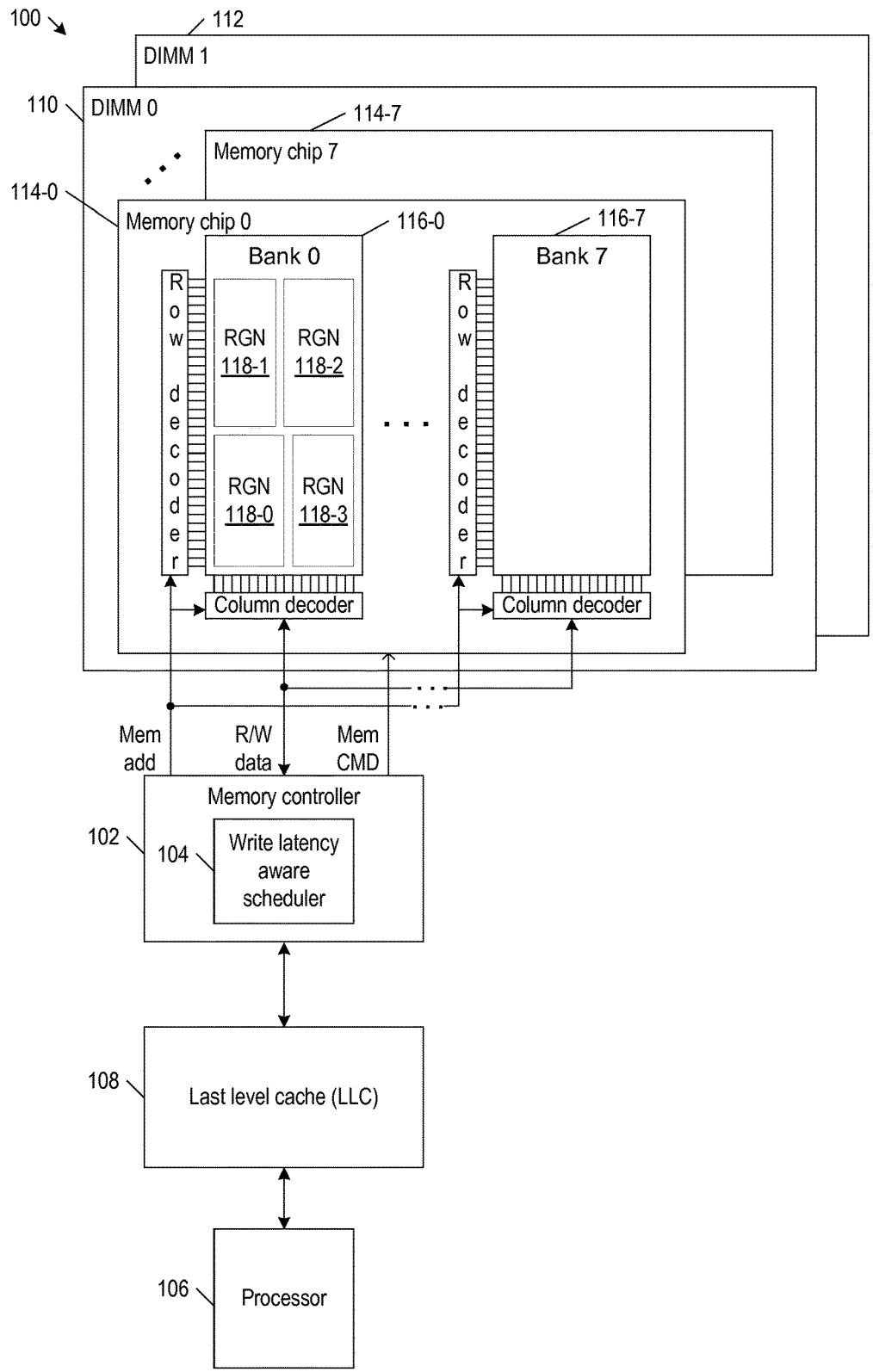
FIG. 1 is a block diagram of a computing system including a memory controller with a write latency aware scheduler in examples of the present disclosure.

FIG. 1 is a block diagram of a computing system 100 including a memory controller 102 with a write latency aware scheduler 104 in examples of the present disclosure. Write latency aware scheduler 104 determines whether or not to issue a queued write request in memory controller 102 based on the write request's latency and the outstanding number of reads to a target memory bank of the write request. Computing system 100 includes a processor 106 that reads from and writes to a last-level cache (LLC) 108, which reads from and writes to a main memory via memory controller 102. Memory controller 102 reads from and writs to memory modules 110 and 112 that make up the main memory. Memory module 110 includes memory chips 114-0 . . . 114-7. Memory chips are organized into ranks and the memory chips in one rank share the same address, command, and data buses. Each memory chip 114 includes memory banks 116-0 . . . 116-7. Each bank includes crossbar arrays with memory cells formed at crossing points between wordlines and bitlines and row, column decoders to access the memory cells. Each memory cell may include a nonlinear selector connected in series with a resistive memory device, such as a memristor. Each crossbar array has regions with different latencies so each bank 116 may be divided into logical regions 118-0 . . . 118-4 with different write latencies. Note logical regions 118 may not be physically contiguous as shown. The write latencies of regions 118-0 . . . 118-4 may be determined during manufacturing or by memory controller 102 during the training or initialization phase.

Memory controller 102 uses a channel to communicate with a particular memory module. Memory controller 102 selects a rank of memory chips via chip select bits and a bank in each memory chip via bank select bits. Memory controller 102 accesses a memory cell in a bank by providing an address and a command.

In some examples of the present disclosure, intermediate levels of cache may be present between processor 106 and LLC 108, processor 106 and LLC 108 may be part of the package, the main memory may include less or more memory modules, each memory module may include less or more memory chips, each memory chip may include less or more memory banks, each bank may include more than one crossbar array, each bank may be divided into less or more regions of different write latencies, and there may be other memory controllers with different types of memories connected to them.

Figure 2:
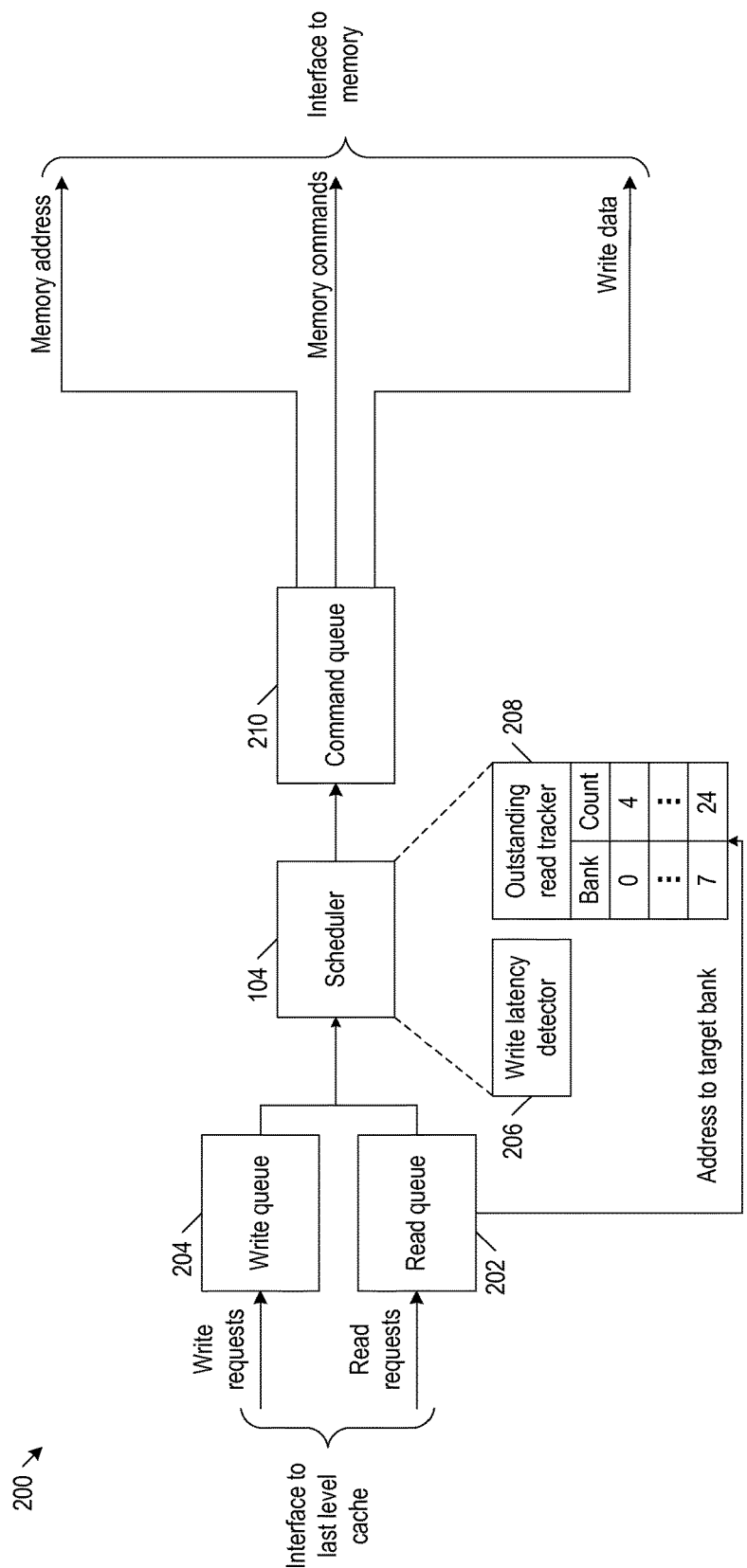
FIG. 2 is a block diagram of a memory controller in examples of the present disclosure.

FIG. 2 is a block diagram of a memory controller 200 in examples of the present disclosure. Memory controller 200 may be used as memory controller 102 in FIG. 1. Memory controller 102 includes a read queue 202, a write queue 204, scheduler 104 with a write latency detector 206 and an outstanding read tracker 208, and a command queue 210. Read queue 202 and write queue 204 stores read requests and write requests, respectively, from LLC 108 (FIG. 1). Scheduler 104 may process read requests in read queue 202 until write queue 204 reaches a high watermark, at which time scheduler 104 drains write requests until write queue 204 is below a low watermark. Scheduler 104 can pick read and write requests out-of-order from read queue 202 and write queue 204, respectively.

Outstanding read tracker 208 tracks the number of outstanding reads to each memory bank. When each read request arrives at read queue 202 from LLC 108, scheduler 104 uses outstanding read tracker 208 to snoop an address from the read request, determine a target memory bank to receive the read request, and update the number of outstanding reads to the target memory bank. Write latency detector 206 determines each write request's latency. When considering to flush a write request in write queue 204 to the main memory, scheduler 104 uses write latency detector 206 to determine the write request's latency and determines a target memory bank to receive the write request determines. Scheduler 104 then determines whether or not to flush that write request based on its write latency and the number of outstanding reads to the target memory bank. Once scheduler 104 determines to flush a write request, scheduler 104 splits the write requests into a series of memory module commands to write to a memory module and queues the memory module commands in command queue 210.

Figure 3:
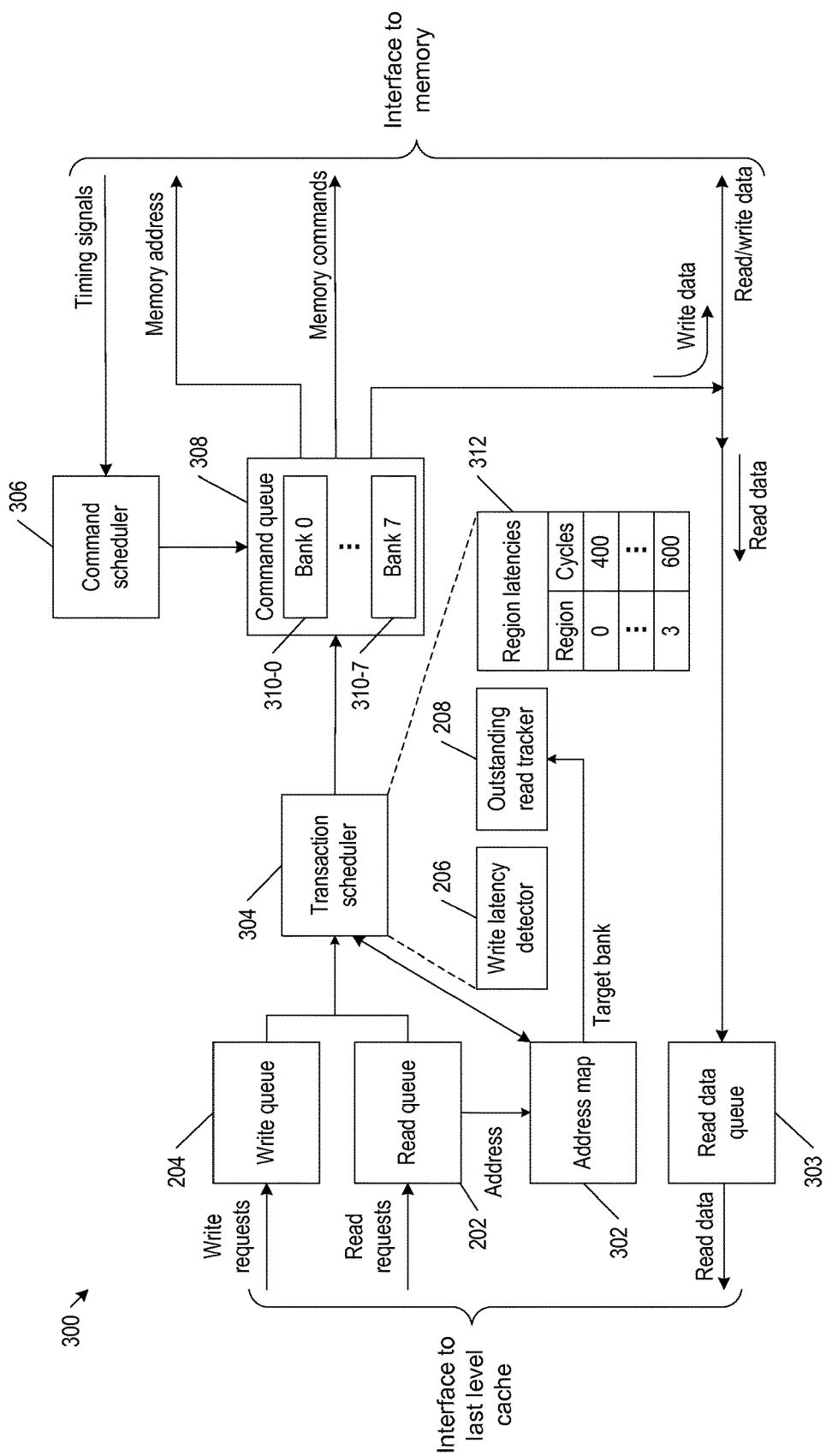
FIG. 3 is a block diagram of a variation of the memory controller of FIG. 2 in examples of the present disclosure.

FIG. 3 is a block diagram of memory controller 300 in examples of the present disclosure. Memory controller 300 is a variation of memory controller 200 in FIG. 2 that further includes an address map 302 and a read data queue 303. Address map 302 translates addresses in the read and write requests to addresses in memory modules 110 and 112 (e.g., channel, rank, bank, row, and column). Read data queue 303 queues read data received from the main memory in response to read requests. In memory controller 300, scheduler 104 (FIG. 2) is shown as a transaction scheduler 304 and a command scheduler 306, and command queue 210 (FIG. 2) is shown as a command queue 308 with bank-level command queues 310-0 . . . 310-7. Transaction scheduler 304 includes write latency detector 206, a region latency table 312, and outstanding read tracker 208.

When each read request arrives at read queue 202 from LLC 108, transaction scheduler 304 uses outstanding read tracker 208 to snoop an address from the read request, look up address map 302 to determine a target memory bank to receive the read request, and update the number of outstanding reads to the target memory bank. When considering flushing a write request in write queue 204 to the main memory, transaction scheduler 304 uses address map 302 to determine a target memory bank to receive the write request, uses outstanding read tracker 208 to determine the number of outstanding read requests to the target memory bank, and uses write latency detector 206 to determine the write request's latency.

Write latency detector 206 may determine the selected write request's latency based on its write data or write location. The write request may have a high latency when the cell location to be written is farther from the driver or when more 0s are located closer to the driver in a multi-bit write. In other examples, write latency detector 206 determines the number of cycles to complete the write request based on a target region in the target memory bank to be written. Write latency detector 206 may look up the target region in region latency table 312 to determine the number of cycles to complete the write request.

Transaction scheduler 304 then determines whether or not to flush that write request based on its write latency and the number of outstanding reads to the target memory bank. Once transaction scheduler 304 determines to flush a write request, transaction scheduler 304 splits the write requests into a series of memory module commands to write to a memory module and queues the memory module commands in a corresponding bank-level command queue in command queue 308.

Command scheduler 306 issues the memory module commands in command queue 308 according to the timing constraints of the memory modules. Command scheduler 306 scans the bank-level command-queues 310-0 . . . 310-7 and picks a command that can be sent out on the address/command channel that cycle. Command scheduler 306 may interleaves requests to different ranks and banks to ensure high parallelism.

Figure 4:
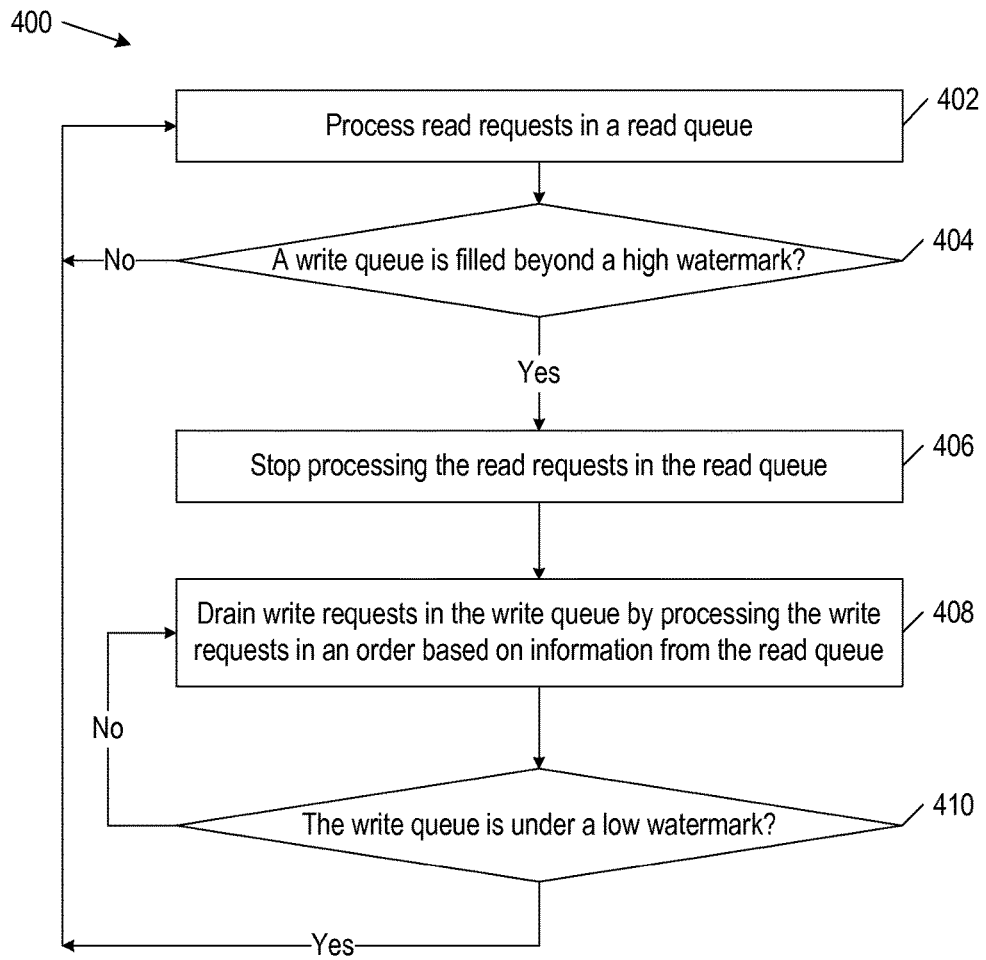
FIG. 4 is a flowchart of a method for the transaction scheduler of FIG. 3 to schedule reads and writes in examples of the present disclosure.

FIG. 4 is a flowchart of a method 400 for transaction scheduler 304 of FIG. 3 to schedule read and write requests in examples of the present disclosure. Method 400 may begin in block 402.

In block 402, transaction scheduler 304 processes read requests in read queue 202 (FIG. 3). Block 402 may be followed by block 404.

In block 404, transaction scheduler 304 determines if write queue 204 (FIG. 3) is filled beyond a high watermark. If so, block 404 may be followed by block 406. Otherwise method 400 loops back to block 402 to continue processing the read requests in read queue 202.

In block 406, transaction scheduler 304 stops processing read requests in read queue 202. Block 406 may be followed by block 408.

In block 408, transaction scheduler 304 drains write requests in write queue 204 by processing the write requests in an order based on information from read queue 202. This information from read queue 202 may be target memory banks of the read requests in read queue 202, which is tracked by outstanding read tracker 208. In some examples, transaction scheduler 304 drains write requests in write queue 204 by processing the write requests in an order based on number of outstanding read requests to target memory banks to receive the write requests and latencies of the write requests. Examples of block 408 are described later. Block 408 may be followed by block 410.

In block 410, transaction scheduler 304 determines if write queue 204 is under a low watermark. If so, method 400 may loop back to block 402 to again process the read requests in read queue 202. Otherwise method 400 may loop back to block 408 to continue to drain the write requests in write queue 204.

Figure 5:
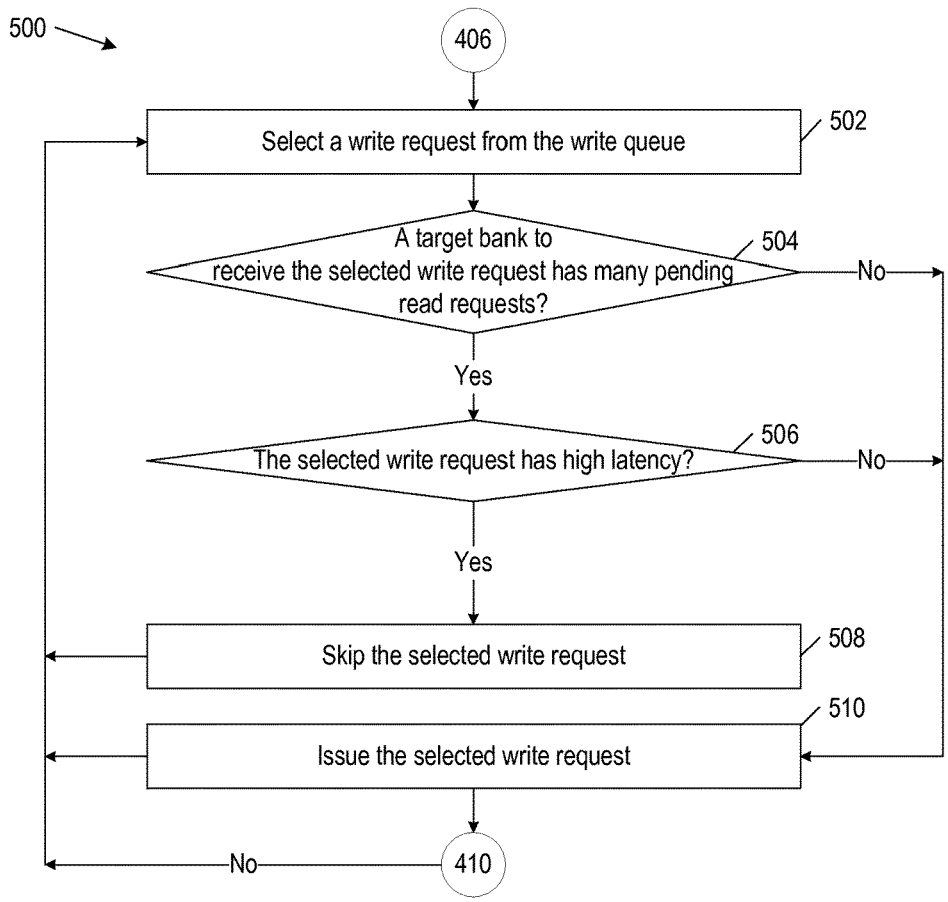
FIGS. 5, 6, 7, and 8 are flowcharts of methods to implement a block in the method of FIG. 4 in examples of the present disclosure.

FIG. 5 is a flowchart of a method 500 to implement block 408 in method 400 of FIG. 4 in examples of the present disclosure. Method 500 may begin in block 502, which may follow block 406 in FIG. 4.

In block 502, transaction scheduler 304 (FIG. 3) selects a next write request from write queue 204 (FIG. 3). Transaction scheduler 304 may select the oldest write request in write queue 204 that it has not selected before. Block 502 may be followed by block 504.

In block 504, transaction scheduler 304 uses outstanding read tracker 208 (FIG. 3) to determine if a target memory bank to receive the selected write request has many pending read requests. The target memory bank has many pending read requests when the number of pending read requests is greater than a maximum read threshold. When the target memory bank has many pending read requests, block 504 may be followed by block 506. Otherwise the target memory bank has few pending read requests and block 504 may be followed by block 510.

In block 506, transaction scheduler 304 uses write latency detector 206 (FIG. 3) to determine if the selected write request has a high latency. In some examples, write latency detector 206 may determine the selected write request's latency based on its write data or write location. When the write request has a high latency, block 506 may be followed by block 508. Otherwise the write request has a low latency and block 506 may be followed by block 510.

In block 508, transaction scheduler 304 skips the selected write requests, which remains in write queue 204. Block 508 may be followed by block 502 where transaction scheduler 304 selects another write request from write queue 204.

In block 510, transaction scheduler 304 issues the selected write request. Block 510 may be followed by block 410 in FIG. 4 to stop processing write requests anytime write queue 204 is under the low watermark.

A deadlock may occur between writing and reading when all the write requests have high latency and all the memory banks have many pending requests. To avoid a deadlock once transaction scheduler has looped through all the write requests in write queue 204, transaction scheduler 304 may first process the write requests with the longest write queue wait time, the write requests with the least number of cycles, or the write requests to the memory bank with the least number of pending reads.

Figure 6:
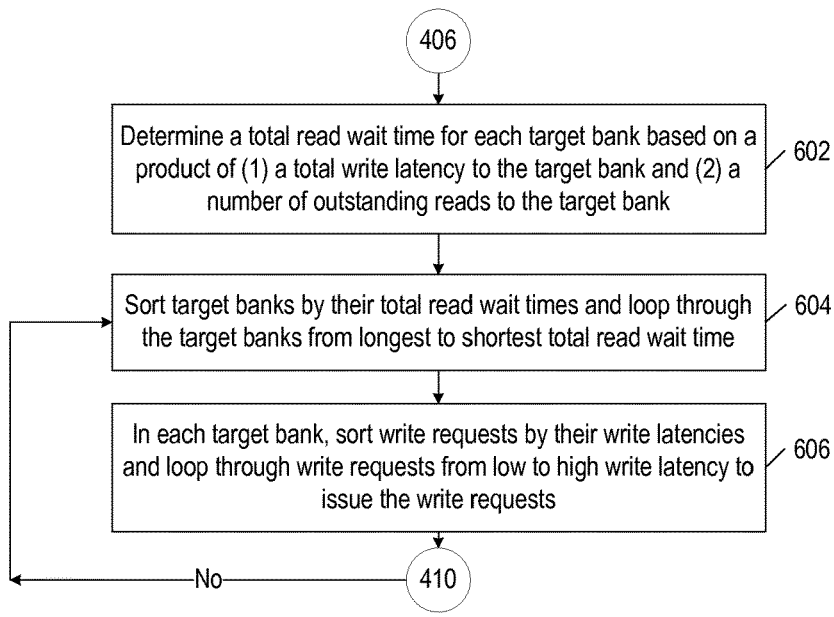

FIG. 6 is a flowchart of a method 600 to implement block 408 in method 400 of FIG. 4 in examples of the present disclosure. Method 600 may begin in block 602, which may follow block 406 in FIG. 4.

In block 602, transaction scheduler 304 determines a total read wait time for each target memory bank based on a product of (1) a total write latency of the target memory bank and (2) a number of outstanding read requests to the target memory bank. The total write latency is the sum of the write requests' write latencies (total number of cycles to complete the write requests) to the target memory bank. The total read wait time assumes all the read requests come from different applications that must all wait together for the write drain to finish. For example, assume a 400-cycle write and a 600-cycle write are to be sent to a memory bank that has 3 pending reads, the total read wait time in the memory bank is 1000 cycles*3=3000 cycles. Block 602 may be followed by block 604.

In block 604, transaction scheduler 304 sorts the target memory banks by their total read wait times and loops through the target memory banks from the longest to the shortest total read wait time. Block 604 may be followed by block 606.

In block 606, for each of the target memory bank being looped through, transaction scheduler 304 sorts the write requests to the target memory bank by their write latencies (number of cycles to complete) and, for each target memory bank, transaction scheduler 304 loops through the write requests from low to high write latency to issue the write requests. Block 606 may be followed by block 410 in FIG. 4 to stop processing write requests anytime write queue 204 is under the low watermark.

Figure 7:
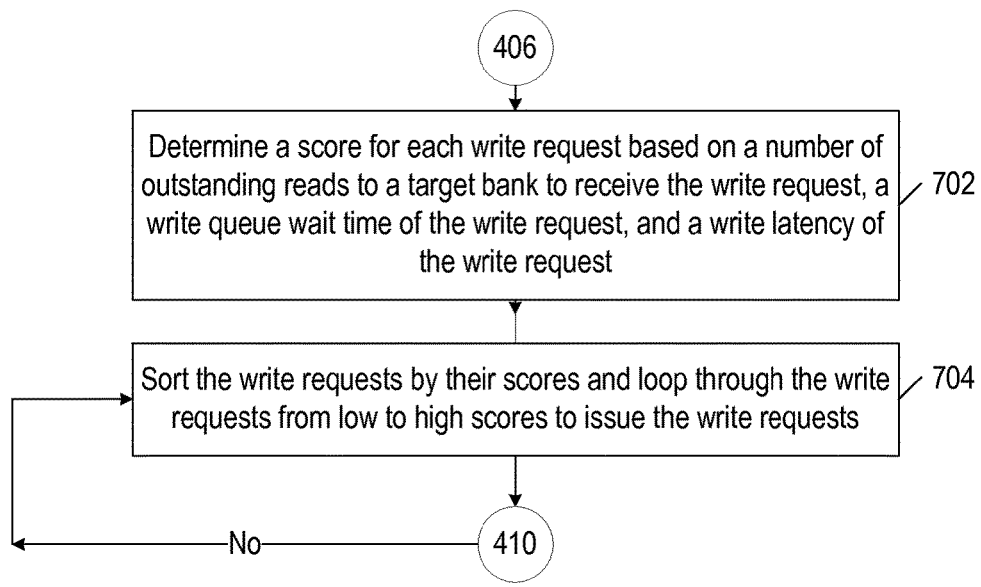

FIG. 7 is a flowchart of a method 700 to implement block 408 in method 400 of FIG. 4 in examples of the present disclosure. Method 700 may begin in block 702, which may follow block 406 in FIG. 4.

In block 702, transaction scheduler 304 determines a score for each write request in write queue 204 (FIG. 3) based on a number of outstanding reads to a target memory bank to receive the write request, a write queue wait time of the write requests, and a write latency of the write request (e.g., number of cycles to complete the write request). For example, the score for each write request may be equal to pending_reads_in_targetbank*a−wait_time_in_queue*b+ write_latency*c where a, b, c are weight factors. For example, the score for each write request may be equal to (pending_reads_in_target-bank*write_latency)−wait_time_in_queue. Block 702 may be followed by block 704.

In block 704, transaction scheduler 304 sorts the write requests by their scores and loops through the write requests from high to low scores to issue the write requests. Block 704 may be followed by block 410 in FIG. 4 to stop processing write requests anytime write queue 204 is under the low watermark.

Figure 8:
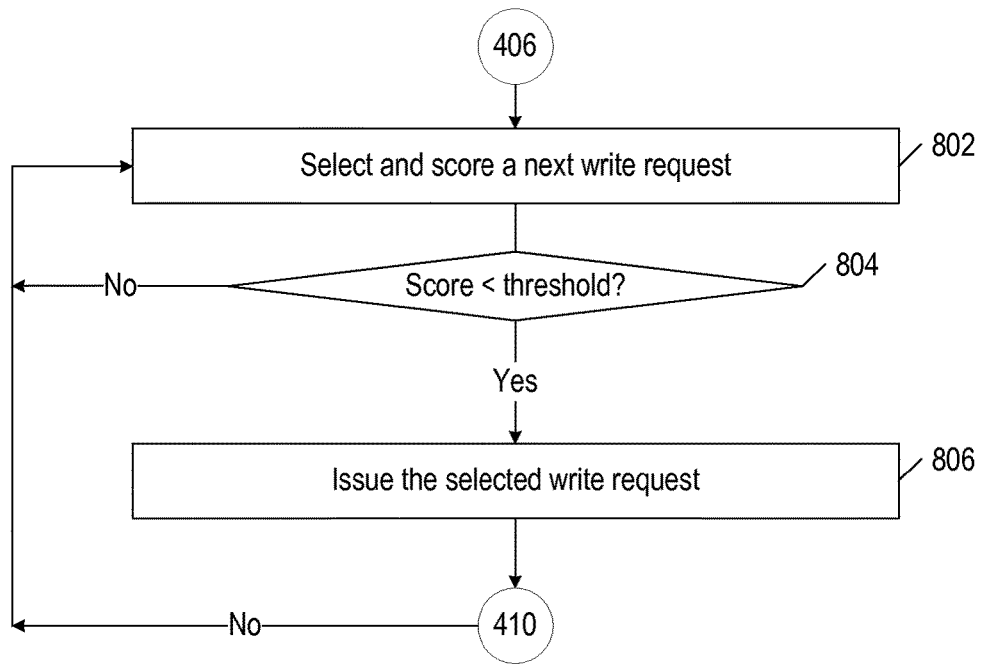

FIG. 8 is a flowchart of a method 800 to implement block 408 in method 400 of FIG. 4 in examples of the present disclosure. Method 800 may begin in block 802, which may follow block 406 in FIG. 4.

In block 802, transaction scheduler 304 selects a next write request in write queue 204 and determines a score for the write request. The score may be similar to the score described in block 702 in FIG. 7. Block 802 may be followed by block 804.

In block 804, transaction scheduler 304 determines if the selected write request's score is less than a score threshold. If so, block 804 may be followed by block 806. Otherwise method 800 loops back to block 802 to select another write request in write queue 204.

In block 806, transaction scheduler 304 issues the selected write request. Block 510 may be followed by block 410 in FIG. 4 to stop processing write requests anytime write queue 204 is under the low watermark.

To avoid a deadlock once transaction scheduler has looped through all the write requests in write queue 204, transaction scheduler 304 may increase the score threshold and make another pass through the write queue.

FIG. 9 is a pseudo code 900 executed by transaction scheduler 304 (FIG. 3) to implement one example of block 408 in method 400 of FIG. 4 in examples of the present disclosure. When write queue 204 (FIG. 3) is greater than the high watermark, transaction scheduler 304 assigns scores or tokens having the same value to the memory banks. While write queue 204 is greater than the low watermark, transaction schedule 304 uses the tokens to determine whether or not to issues write requests as follows.

For each memory bank, transaction scheduler 304 decrements the token by the number of outstanding read requests to the memory bank. When the token becomes less than or equal to 0, transaction scheduler 304 stops issuing write requests to the memory bank. Otherwise transaction scheduler 304 issues one write request at a time to the memory bank and updates the token. When the write request is a fast write (low latency), transaction scheduler 304 decrements the token by one. When the write request is a slow write (high latency), transaction scheduler 304 decrements the token by a value greater than one.

Specifically, pseudo code operates as follows. In line 1, transaction scheduler 304 maintains a first while loop when the number of write requests in write queue (WQ) 204 is less than the high watermark (WQHT). In the first while loop, transaction scheduler 304 starts to drain write queue 204. In line 3, transaction scheduler 304 initializes a number of issued write requests "nW" (i.e., the number of writes rained) to 0. In line 4, transaction scheduler initializes a token "maxWi" to a constant M for each memory bank where "i" identifies a particular memory bank.

In line 5, transaction scheduler 304 maintains a second while loop when the number of write requests in write queue 204 is greater than the low watermark (WQLT). The number of write requests in write queue 204 is determined by decrementing its original value by the number of issued write requests nW. In the second while loop, transaction scheduler 304 determines whether or not to process write requests to a particular memory bank. In line 6, transaction scheduler 304 decrements token maxWi for memory bank i by the number of read requests to bank i.

In line 7, transaction scheduler 304 determines if token maxWi is less than or equal to 0. If so, in line 8, transaction scheduler 304 stops issuing write requests to memory bank i by exiting the second while loop.

In line 9, transaction scheduler 304 determines token maxWi is not less than or equal to 0. In line 10 transaction scheduler 304 issues one write requests "ReqW" to bank i. The write requests are issued based on the order in which they are queued in write queue 204. In line 11, transaction scheduler 304 increments the number of issued writes request nW by one.

In line 12, transaction scheduler 304 determines if the issued write request ReqW is a fast write (low latency). If so, in line 13 when the issued write request ReqW is a fast write, transaction scheduler 304 decrements token maxWi by one.

In line 14, transaction scheduler 304 determines the issued write request ReqW is not a fast write. In line 16, transaction scheduler 304 increments token maxWi by a constant W that is greater than one.

Line 17 ends the branch started in line 12.
Line 18 ends the branch started in line 7.
Line 19 ends the second while loop started in line 4.
In line 20, transaction scheduler 304 determines the number of write requests in write queue (WQ) 204 is not greater than the high watermark (WQHT). In line 21, transaction scheduler 304 issues the read requests in read queue 202 (FIG. 3).

Line 22 ends the first while loop started in line 1.
FIG. 10 is a block diagram of a computing device 1000 for implementing transaction scheduler 304 of FIG. 3 in examples of the present disclosure. Instructions 1002 to schedule write requests based on write latency and outstanding reads to memory banks are stored in a non-transitory computer readable medium 1004, such as a read-only memory. A processor 1006 executes instructions 1002 to provide the described features and functionalities. Processor 1006 communicates with other components via a network interface 1008.

Various other adaptations and combinations of features of the examples disclosed are within the scope of the invention.

What is claimed is:

1. A method to access a memory chip that has memory banks, the method comprising:
    processing read requests in a read queue;
    when a write queue is filled beyond a high watermark:
        stopping the processing of the read requests in the read queue;
        draining the write queue until the write queue is under a low watermark, comprising processing write requests in an order based on information from the read queue, wherein the information from the read queue comprises target memory banks of the read requests;
        tracking numbers of outstanding read requests to the target memory banks based on the information, wherein processing the write requests in the write queue in the order comprises:
            processing the write requests based on write latencies of the write requests and the numbers of outstanding read requests to the target memory banks,
            determining a total read wait time for each target memory bank comprising a product of a total latency of write requests to the target memory bank and a number of outstanding read requests to the target memory bank, and
            issuing the write requests by looping through the target memory banks from longest to shortest total read wait times and, for each target memory bank being looped, looping through write requests to the target memory bank from shortest to longest write latencies; and
    when the write queue is under the low watermark, stopping the draining of the write queue and again processing the read requests in the read queue.

2. The method of claim 1, wherein processing the write requests in the write queue in the order further comprises:
    selecting a write request from the write queue;
    determining a number of outstanding read requests to a target memory bank to receive the selected write requests; and
    when the target memory bank to receive the selected write requests has many outstanding read requests, skipping the selected write request.

3. The method of claim 2, wherein processing the write requests in the write queue in the order comprises:
    determining a write latency of the selected write request;
    when the target memory bank to receive the selected write requests has few outstanding read requests or the selected write request is a fast write, processing the selected write request.

4. The method of claim 1, wherein:
    the write latencies are based on data pattern or write locations in the target memory banks; and
    an individual target memory bank has many outstanding read requests when a number of outstanding read requests to the individual target memory bank is greater than a threshold.

5. A memory controller for a memory chip having memory banks, comprising:
    a read queue holding read requests;
    a write queue holding write requests;
    a command queue holding memory commands;

a scheduler to:
issue the write request in an order based on write latencies of the write requests and numbers of outstanding read requests to the memory banks,
convert the write requests into resistive random access memory (RAM) commands,
place the resistive RAM commands in the command queue,
process the read requests in the read queue, and
when the write queue is filled beyond a high watermark:
stop the processing of the read requests in the read queue;
drain the write queue in an order based on the write latencies and the numbers of outstanding read requests to the memory banks until the write queue is under a low watermark, wherein draining the write requests in the write queue in the order comprises:
determining a score for each write request based on a number of outstanding read requests to a target memory bank to receive the write request, a write queue wait time of the write request, and a write latency of the write request, and
issuing the write requests by looping through the write requests from lowest to highest scores or whenever a write request has a score less than a threshold; and
when the write queue is under the low watermark, stop the draining of the write queue and again issue the read requests in the read queue, the scheduler comprising:
a write latency detector to determine the write latencies; and
an outstanding read tracker to track the numbers of outstanding read requests to the memory banks.

6. The memory controller of claim 5, wherein draining write requests in the write queue in the order comprises:
selecting a write request from the write queue;
determining a write latency of the selected write request and a number of outstanding read requests to an individual target memory bank to receive the selected write requests;
when the selected write request is a slow write or the individual target memory bank has many outstanding read requests, skipping the selected write request; and
when the selected write request is a fast write or the individual target memory bank has few outstanding read requests, issuing the selected write request.

7. The memory controller of claim 5, further comprising a write latency table listing regions in the memory banks and the regions' write latencies, wherein the write latency detector determines the write latencies from the write latency able.

8. A non-transitory computer-readable medium encoded with instructions executable by a memory controller to:
process read requests in a read queue;
when a write queue is filled beyond a high watermark:
stop the processing of the read requests in the read queue,
drain the write queue until the write queue is under a low watermark by processing write requests in an order based on information from the read queue, wherein the information from the read queue comprises target memory banks of the read requests;
track numbers of outstanding read requests to the target memory banks based on the information, wherein processing the write requests in the write queue in the order comprises:
processing the write requests based on write latencies of the write requests and the numbers of outstanding read requests to the target memory banks,
determining a score for each write request based on a number of outstanding read requests to a target memory bank to receive the write request, a write queue wait time of the write request, and a write latency of the write request, and
issuing the write requests by looping through the write requests from lowest to highest scores; and
when the write queue is under the low watermark, stop the draining of the write queue and again process the read requests in the read queue.

9. A method to access a memory chip that has memory banks, the method comprising:
processing read requests in a read queue;
when a write queue is filled beyond a high watermark:
stopping the processing of the read requests in the read queue;
draining the write queue until the write queue is under a low watermark, comprising processing write requests in an order based on information from the read queue, wherein the information from the read queue comprises target memory banks of the read requests;
tracking numbers of outstanding read requests to the target memory banks based on the information, wherein processing the write requests in the write queue in the order comprises:
processing the write requests based on write latencies of the write requests and the numbers of outstanding read requests to the target memory banks,
determining a score for each write request based on a number of outstanding read requests to a target memory bank to receive the write request, a write queue wait time of the write request, and a write latency of the write request, and
issuing the write requests by looping through the write requests from lowest to highest scores; and
when the write queue is under the low watermark, stopping the draining of the write queue and again processing the read requests in the read queue.

10. A method to access a memory chip that has memory banks, the method comprising:
processing read requests in a read queue;
when a write queue is filled beyond a high watermark:
stopping the processing of the read requests in the read queue;
draining the write queue until the write queue is under a low watermark, comprising processing write requests in an order based on information from the read queue, wherein the information from the read queue comprises target memory banks of the read requests;
tracking numbers of outstanding read requests to the target memory banks based on the information, wherein processing the write requests in the write queue in the order comprises:

processing the write requests based on write latencies of the write requests and the numbers of outstanding read requests to the target memory banks, selecting and determining a score for a next write request in the write queue, the score being based on a number of outstanding read requests to a target memory bank to receive the write request, a write queue wait time of the write request, and a write latency of the write request, issuing the write requests when the score is less than a threshold, and repeating the selecting and the issuing; and when the write queue is under the low watermark, stopping the draining of the write queue and again processing the read requests in the read queue.

* * * * *